United States Patent [19]

Blackburn

[11] Patent Number: 4,591,855

[45] Date of Patent: May 27, 1986

[54] APPARATUS FOR CONTROLLING A PLURALITY OF CURRENT SOURCES

[75] Inventor: Tom L. Blackburn, San Jose, Calif.

[73] Assignee: GTE Communication Products Corporation, Phoenix, Ariz.

[21] Appl. No.: 565,568

[22] Filed: Dec. 27, 1983

[51] Int. Cl.[4] .............................................. G08C 15/08
[52] U.S. Cl. ........................ 340/870.13; 340/870.04; 340/870.39
[58] Field of Search ............... 340/870.04, 870.13, 340/870.39; 364/138, 139, 152, 172, 563, 571, 492; 323/312

[56] References Cited

U.S. PATENT DOCUMENTS

| | | | |
|---|---|---|---|
| 4,146,750 | 3/1979 | Spiesman | 340/870.13 |
| 4,204,249 | 5/1980 | Dye | 364/492 |
| 4,442,716 | 4/1984 | Coe | 340/870.13 |
| 4,466,071 | 8/1984 | Russell | 364/492 |
| 4,532,601 | 7/1985 | Londerking | 364/571 |
| 4,541,065 | 9/1985 | Faulkner | 364/571 |
| 4,549,180 | 10/1985 | Masuda | 340/870.13 |

Primary Examiner—John W. Caldwell, Sr.
Assistant Examiner—Michael F. Heim
Attorney, Agent, or Firm—Douglas M. Gilbert

[57] ABSTRACT

A microprocessor controller converts one or more sensor signals to a time multiplexed digital signal which is converted to an analog voltage signal by a digital-to-analog converter. A switching circuit, under the control of the microprocessor, selectively applies the analog signal to a plurality of current sources thereby setting the output current from each current source.

1 Claim, 4 Drawing Figures

APPARATUS FOR CONTROLLING A PLURALITY OF CURRENT SOURCES

CROSS-REFERENCE TO RELATED APPLICATION

This application is related to copending application Ser. No. 606,804, filed May 3, 1984 entitled "APPARATUS FOR PROVIDING GAIN AND SLOPE CORRECTION IN AN ANALOG SUBSCRIBER CARRIER SYSTEM" which is assigned to the same assignee as the instant application.

BACKGROUND OF THE INVENTION

This invention relates to apparatus for accurately controlling a number of current sources and, more particularly, to a technique by which each current source is periodically addressed by an associated control signal by the use of a time sharing arrangement.

Background Description:

Analog circuits such as variable gain amplifiers, variable attenuators, and active equalizers are often controlled with variolossers, current controlled amplifiers, programmable operational amplifiers, and other similar devices. However, the operation of these devices requires variable current sources to provide an output current that varies in accordance with some status signal.

The application of such control devices is often found in telecommunication systems where pilot signals are used for monitoring the transmission characteristics of all the circuits in the signal path of interest. Pilot detectors monitoring such pilots provide DC output signals, the amplitude of which is proportional to the level of the pilots selected. These DC signals are used to control or drive multiple current sources which in turn control the transmission function of the analog circuits mentioned above (variable gain amplifiers, etc).

In actual operation, a change in ambient temperature might cause, for example, an unwanted change in system gain. Variations in pilot levels caused by a system gain change would be detected by pilot detectors. Change in DC output signals from pilot detectors in turn would produce corresponding changes in gain or loss of amplitude sensitive devices (amplifiers or attenuators).

This technique is adequate for circuits where some degree of error (caused by mismatched components and temperature variations) is tolerable. In a system where only very small changes in level can be tolerated, this technique is inadequate, particularly where a system level alignment cannot be made. It is an object of this invention to provide apparatus for controlling a system parameter, such as system gain, where only very slight changes in the system parameter can be tolerated.

SUMMARY OF THE INVENTION

Status signals are conditioned to derive a plurality of DC signals, one for each of a plurality of current sources. Each DC signal is used to control the current output of its associated current source on a time shared basis. The current output of each current source is employed to control a characteristic such as the gain, loss or Q of an associated circuit.

DETAILED DESCRIPTION OF THE INVENTION

Figure 1:
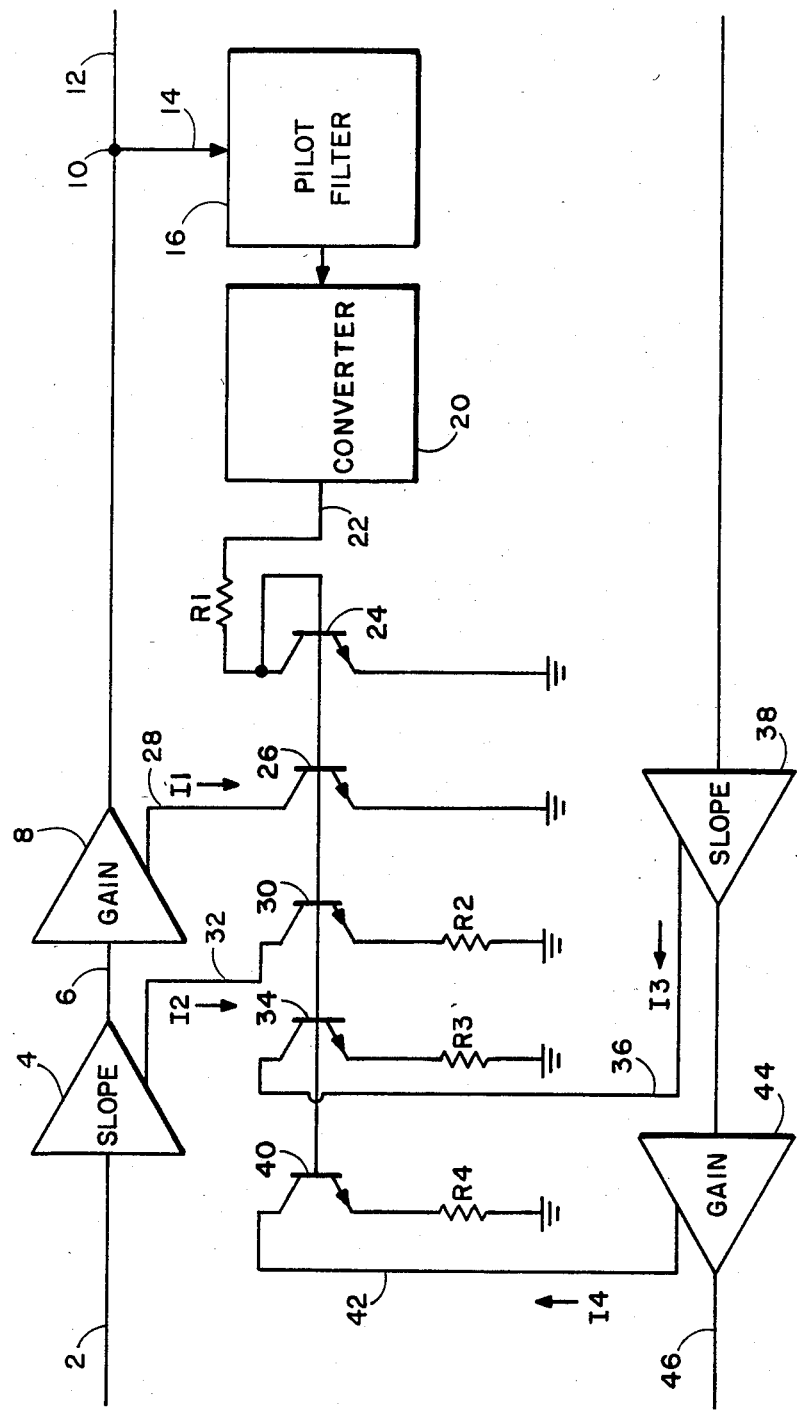
FIG. 1 is a schematic diagram which illustrates how a signal control signal is customarily used with a plurality of current sources in the repeater circuit of a carrier current system.

Referring now to FIG. 1 a prior art technique is shown, by which current sources control the gain and slope (gain vs. frequency) of two signal transmission paths. The upper transmission signals enter along path 2 to a slope correction amplifier device 4. The signals then follow path 6 to the input of another amplifier 8 and then to an output port along path 12. A pilot filter circuit 16 bridges onto the output at junction 10. The pilot filter selects only the pilot signal transmitted and passes the pilot signal to the AC to DC converter 20 which derives a DC control signal. The DC control signal reflects the status of the signals on path 12 and indirectly reflects the operational status of the circuits through which the pilot is sent. This control signal is applied via path 22 through R1 to enable the transistor amplifier 24 which is adjusted to provide the appropriate base emitter voltage to drive the four current sources 26, 30, 34 and 40. Current source 26 provides the control current I1 along path 28 to control the gain of amplifier 8. Similarly, current source 30 provides current I2 along path 32 for the slope correction amplifier 4. Resistors R3 and R4 in current sources 34 and 40 are selected to provide the proper output control currents I3 and I4 along paths 36 and 42 for slope amplifier 38 and amplifier 44. As may be understood from the above description, such an arrangement does not provide for a refined correction, and in addition, the serial connection of the current sources adds certain temperature variations which may not always be tolerable.

Figure 2:
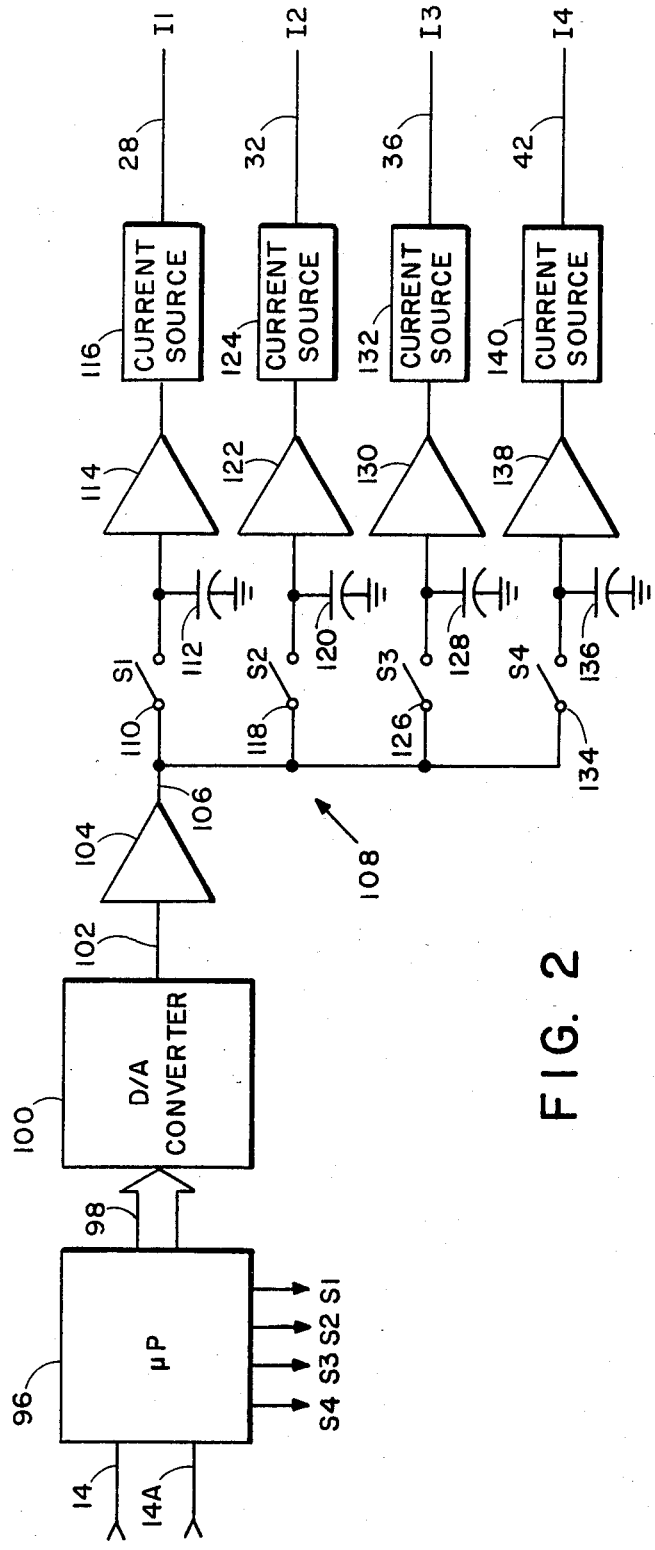
FIG. 2 is a block diagram which illustrates how the pilot signals of a carrier system such as shown in FIG. 1 may be used to generate separate control signals for each current source.

FIG. 2 illustrates the manner in which this invention may be employed to provide the variable currents to control the gain and slope dependent amplifiers in the two directions of transmission of a system similar to the one shown in FIG. 1. In this case there are two input status signals: one on path 14 and one on path 14A generated by separate pilot detectors (not shown). Two different pilot frequencies are used here: one which is below and one which is above the transmission band. A microprocessor 96 operates on these pilot status signals to provide four sequential digital signals for each time period of 1 second. Each signal on path 98 is an 8-bit parallel coded signal. A digital to analog (D/A) converter 100 converts each of the four separate coded output signals into four DC output currents that appear on path 102. The output current from the D/A converter 100 is amplified by buffer amplifier 104. Each of the four separate DC signals appears sequentially along path 106 and are applied to the input of the switching circuits 108 to be routed to the appropriate current source. A sample and hold circuit and a buffer amplifier, associated with each current source, pick off the proper DC signal and apply it to the associated current source.

Figure 3:
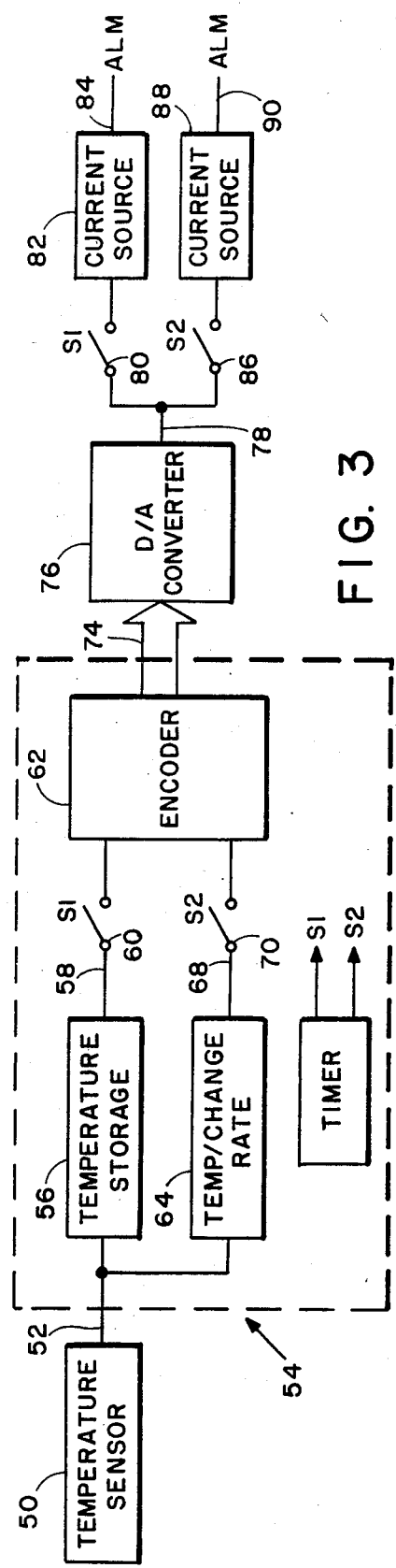
FIG. 3 is a block diagram which illustrates how the teaching of the instant invention may be used to provide time shared control of current sources.
Figure 4:
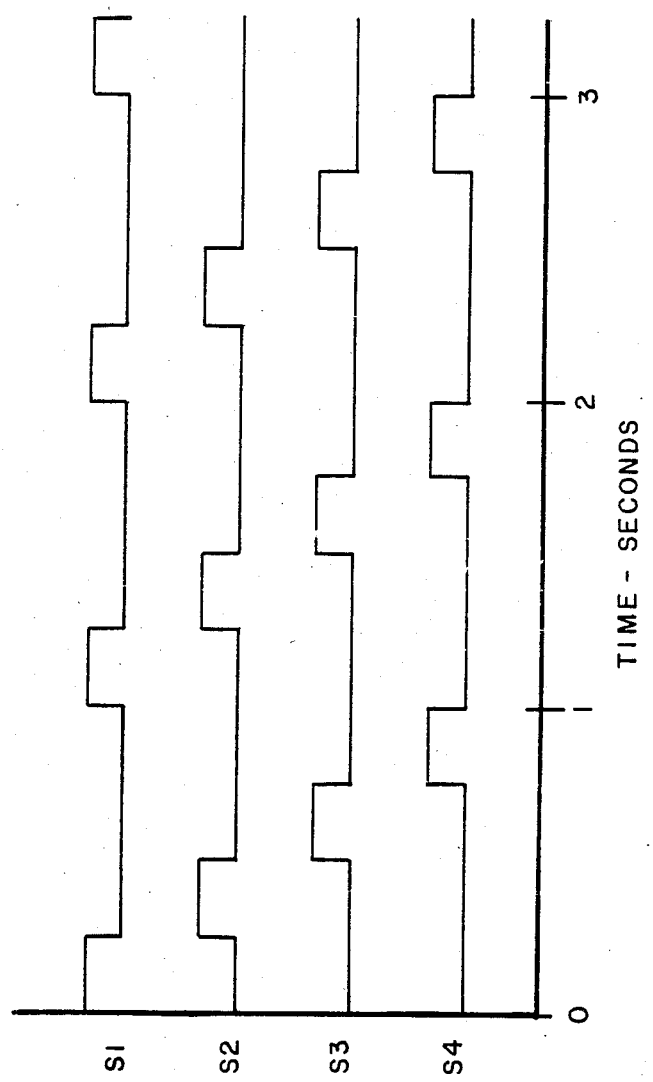
FIG. 4 is a timing diagram which illustrates the timing sequence for switches (110), (118), (126), and (134) of FIG. 3.

For example, when the DC signal for current source 116 is present on path 106, the switch 110 is momentarily closed by the timing pulse S1 (see FIG. 4). The voltage sample is held by storage capacitor 112 and applied to the input of amplifier 114. As noted by the timing diagram shown in FIG. 4, each of the switches 110, 118, 126, 134 are closed for 0.25 second and the sequences repeated every 1 second. All of the timing pulses, S1–S4 controlling the associated switches, preferably are generated by the microprocessor 96. Storage capacitors 112, 120, 128 and 136 store the control voltage during the time when the associated switch is open so as to provide the proper control input to the respective current sources 116, 124, 132 and 140. Thus the voltage on each capacitor controls the current source, to provide the correct current output noted in FIG. 3 as I1, I2, I3, and I4. Each capacitor is refreshed periodically to keep it charged to the correct voltage. The amplifiers 114, 122, 130 and 138 should have a high input impedance so as not to discharge the capacitors unnecessarily. Further, the capacitors themselves should be of the low leakage variety.

It should be understood that there is virtually no limit as to the number of current sources that can be controlled by the techniques disclosed in this invention. As the number of current sources is increased certain changes would have to be made, including the timing cycle which affects the refreshed cycle of the capacitors, the discharge characteristics of the capacitor and the characteristics of the amplifiers employed. The microprocessor 96 used in the preferred embodiment, a "400 Series" MicroController manufactured by National Semiconductor Corporation, Santa Clara, Calif., would be able to accommodate a large number of controlled current sources.

FIG. 3 shows an alternate embodiment in which a temperature sensor 50 provides a status signal proportional to the temperature sensed, along path 52 to a control signal generator 54. Generator 54 includes a storage device 56 that stores the status signal for a short period of time and also passes the status signal out along path 58 through timed switch 60 to encoder 62. Encoder 62 provides a parallel output of several binary digits which may be 2, 4, 6 or 8 bits, depending upon the accuracy with which the temperature is to be read. This coded output is applied via path 74 to the input of D/A converter 76. The temperature change rate device 64 accepts the status signal on path 52 and the stored temperature from temperature storage 56 via path 66, so as to determine a rate of change of temperature which is applied as an output signal along path 68 via timed switch 70 to a second input of encoder 62. Thus at a separate time from the input from the temperature storage 56 along path 58 a different signal is feed to the encoder 62 and a separate coded output is applied via path 74 to the input of D/A converter 76. On a timed basis then these signals appear at the output of D/A converter 76 on path 78. Each is applied to the appropriate current source either 82 or 88 via switches 80 and 86 that are closed only when the appropriate control signal appears on path 78. The current source 82 can provide a variable current output on path 84 to some sort of a control device that would regulate the temperature of the device in which the temperature sensor 50 is a part. The time rate of change in this case has been employed so as to indicate whether or not an alarm condition exists. Thus the output on path 90 would go to some sort of an alarm device (the value of the current output of current source 88 determining whether or not an alarm condition would be existent).

What is claimed is:

1. Apparatus for controlling the magnitude of output current flowing in each of a plurality of current sources, which comprises:

sensor means providing status signals indicative of at least one parameter being sensed;

microprocessor means coupled to said sensor means and responsive to said status signals for generating at a first output a plurality of binary codes corresponding to said plurality of current sources, respectively, each code representing an amplitude that is defined by at least one of said status signals, and for generating at a plurality of second outputs a plurality of timing signals;

digital-to-analog converter means coupled to said first output for converting said plurality of binary codes to an equal number of analog signals;

buffer amplifier means for buffering said analog signals;

sample and hold means having common inputs coupled to said buffer amplifier means for selectively transferring, in response to said timing signals, said analog signals to each of said plurality of current sources, said analog signals controlling the output current from said plurality of current sources;

said plurality of second outputs selectively coupled to ones of said sample and hold means for controlling the proper timing sequence thereof.

* * * * *